(12) United States Patent
Liao et al.

(10) Patent No.: US 8,138,811 B2
(45) Date of Patent: Mar. 20, 2012

(54) KEY PRESS DETECTING CIRCUIT

(75) Inventors: Zhi Jun Liao, Beijing (CN); Robert Warren Schmidt, Carmel, IN (US); Ai Hua Sun, Beijing (CN)

(73) Assignee: Thomson Licensing, Issy les Moulineaux (FR)

( * ) Notice: Subject to any disclaimer, the term of this patent is extended or adjusted under 35 U.S.C. 154(b) by 0 days.

(21) Appl. No.: 12/453,597

(22) Filed: May 13, 2009

(65) Prior Publication Data

US 2009/0284301 A1 Nov. 19, 2009

(30) Foreign Application Priority Data

May 15, 2008 (EP) .................................... 08305172

(51) Int. Cl.
*H03K 3/02* (2006.01)

(52) U.S. Cl. .............. 327/198; 327/18; 327/21; 327/50; 327/77

(58) Field of Classification Search .............. 327/18–21, 327/50–53, 77–80, 198
See application file for complete search history.

(56) References Cited

U.S. PATENT DOCUMENTS

| | | |
|---|---|---|
| 3,576,485 A | 4/1971 | Coons |
| 4,668,875 A | 5/1987 | Miyazaki et al. |
| 5,140,178 A | 8/1992 | Yoshihara et al. |
| 2002/0060619 A1 | 5/2002 | Mani et al. |
| 2005/0237680 A1* | 10/2005 | Egner ............................. 361/42 |
| 2008/0224638 A1* | 9/2008 | Cheng et al. .................. 315/349 |

FOREIGN PATENT DOCUMENTS

GB 2095015 9/1982

OTHER PUBLICATIONS

Search Report, Oct. 2, 2008.
"Viele Anwendungsfaelle—viele Losesungen: Entprellshal Tungen Fuer Schalter Und Tasten" vol. 58, No. 16 p. 67 XP001603915 ISSN: 0016-2841.

* cited by examiner

*Primary Examiner* — Lincoln Donovan
*Assistant Examiner* — Shikha Goyal
(74) *Attorney, Agent, or Firm* — Robert D. Shedd; Jeffrey M. Navon

(57) ABSTRACT

A key press detecting circuit for detecting the status of the key is provided. The key press detecting circuit comprises a discharging circuit which discharges when the key (K1) is pressed; and a voltage detecting circuit, which comprises a combination of a PNP transistor (T2) and a NPN transistor (T3), wherein when the discharging circuit discharges for a predefined period, the PNP transistor (T2) will be turn on, which causes the NPN transistor (T3) to be turned on and to output a second signal for a second function.

12 Claims, 4 Drawing Sheets

KEY PRESS DETECTING CIRCUIT

This application claims the benefit, under 35 U.S.C. §119, of European Patent Application No. 08305172.2 filed May 15, 2008.

FIELD OF THE INVENTION

The invention relates to a key press detecting circuit, especially to a dual mode key press detecting circuit.

BACKGROUND OF THE INVENTION

Nowadays, there are applications using one key to perform two functions. For example, the power key on some cell phones can perform both power on/off and another function, e.g. an 'exit' function. When the cell phone is in the power-on mode, if a user presses the power key for less than a certain pre-defined time threshold, the key will trigger the 'exit' function. And if the user presses the power key for a longer period than the pre-defined time threshold, he will turn off the cell phone.

Traditionally a way to realize these multiple functions on one key is to use a power management chip or microcontroller or microcomputer. However, this traditional circuit is complex and expensive.

U.S. Pat. No. 5,140,178 describes a double function key especially a reset circuit for microcomputer.

SUMMARY OF THE INVENTION

In an aspect, a key press detecting circuit for detecting the status of the key is described. The key press detecting circuit comprises a discharging circuit which discharges when the key is pressed; a voltage detecting circuit, which comprises a combination of a PNP transistor and a NPN transistor, wherein when the discharging circuit discharges for a pre-defined period, the PNP transistor will be turn on, which causes the NPN transistor to be turned on and to output a first signal for the first function.

Further, in the key press detecting circuit, the discharging circuit is a Resistor-Capacitor circuit.

In a detailed embodiment, the predefined period is at least determined by the resistor and the capacitor of the Resistor-Capacitor.

In another embodiment, the key press detecting circuit includes a charging circuit to charge the capacitor of the discharging circuit when the key is released.

In still another embodiment, the charging circuit includes a third transistor which is turned on to charge the capacitor when the key is released.

According to an embodiment, if the key is pressed a second signal is sent out for a second function.

According to another embodiment, the first signal can be detected by a key scanning circuit.

DETAILED DESCRIPTION OF THE INVENTION

Figure 1:
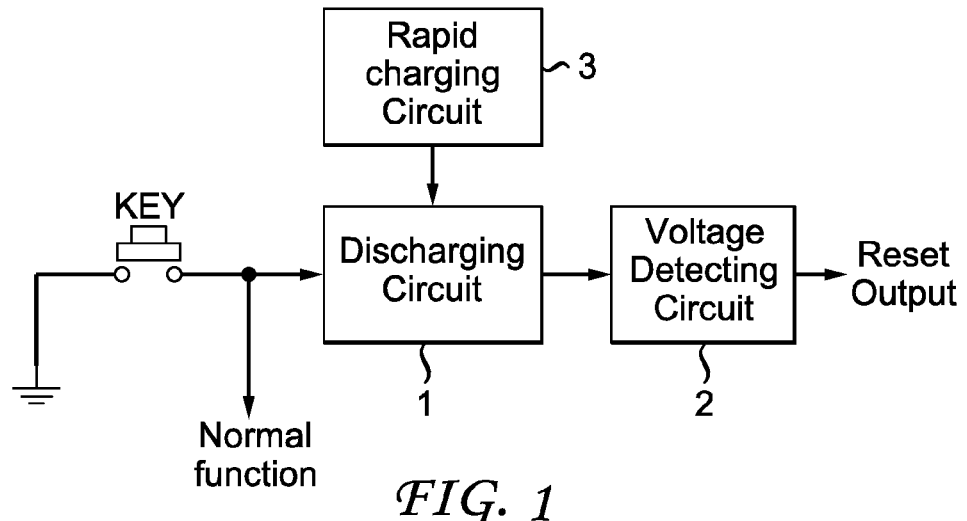
FIG. 1 shows a block diagram of principle of a key circuit which can perform two functions.

Referring to FIG. 1, it shows a block diagram of a key circuit which can perform two functions. The circuit mainly includes a key, a discharging circuit 1, a voltage detecting circuit 2, and a rapid charging circuit 3. The first function is a normal key function and the second function is for example a reset function.

Figure 2:
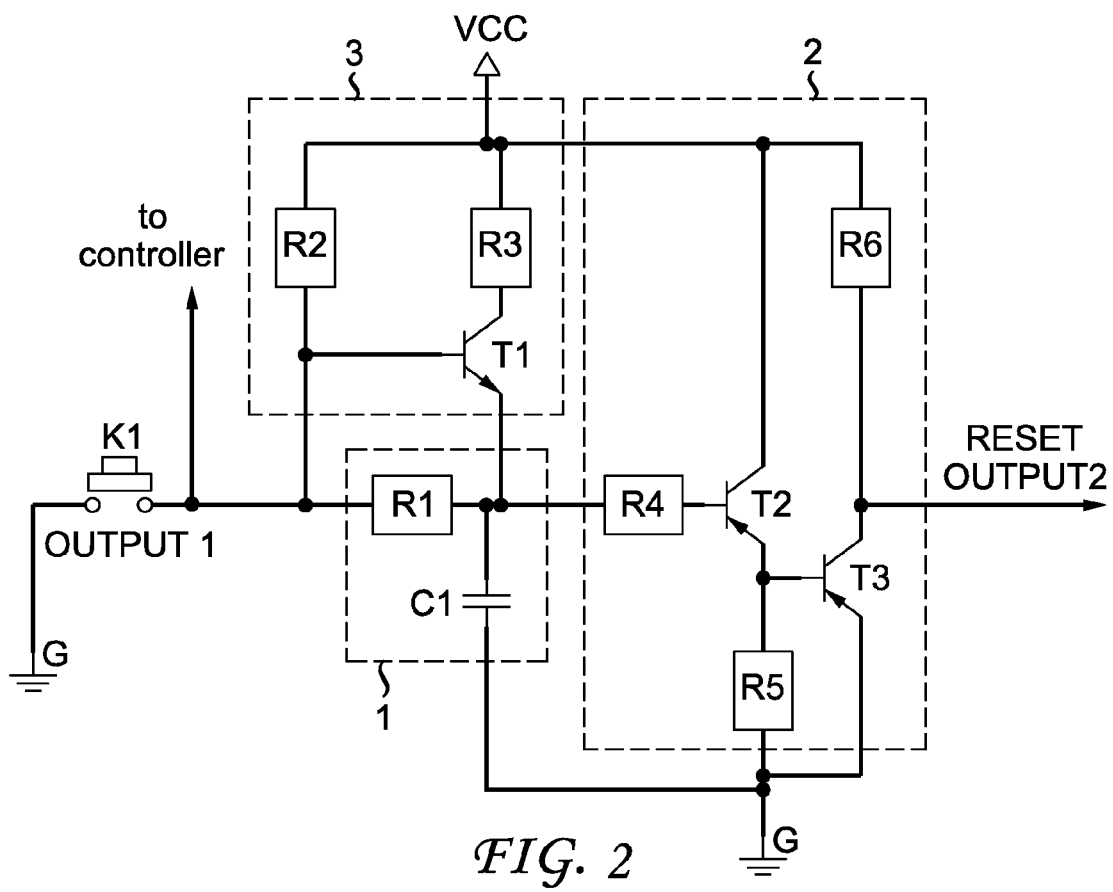
FIG. 2 shows a circuit diagram of a key circuit which can perform two functions according to a first embodiment.

Now turn to FIG. 2. It further elaborates the principle of FIG. 1. In FIG. 2, it shows a detailed embodiment illustrating a key press detecting circuit of a two-function key which can perform two functions. One function is a normal key function. For example, on a cell phone, the normal key function is inputting a digit. The other function is, e.g. a reset function on the cell phone. Here the cell phone is just introduced for explaining the present principle and should not be construed as any limitation. The present principle can be used in other devices and for keys which are intended to carry out two or more functions.

In the circuit of FIG. 2, K1 is the two-function key. The circuit mainly includes three parts: a discharging part, a voltage detecting part, and a rapid charging part. The discharging part circuit includes a resistor R1 and a capacitor C1. The rapid charging part circuit includes two resistors R2 and R3 and a transistor T1. And the voltage detecting part circuit is made up of transistors T2 and T3 and resistors R4, R5, and R6.

The first terminal of the two-function key K1 is grounded, and the second terminal of K1, OUTPUT1, is connected to a source voltage Vcc via a resistor R2 and grounded through a resistor R1 serially connected to capacitor C1. The second terminal of K1 is also connected to the base of transistor T1. The collector terminal of the transistor T1 is connected to the source voltage Vcc via a resistor R3, and the emitter terminal thereof is grounded through the capacitor C1. Between the source voltage Vcc and the ground there is a PNP transistor T2 serially connected a resistor R5, with the emitter of T2 connecting to the source voltage, and the collector of PNP transistor T2 connecting to the resistor R5. And the base of T2 is coupled to the emitter of T1 via a resistor R4. The collector of T2 is also connected to the base of a transistor T3. While the collector of T3 is connected to the source voltage through a resistor R6 and its emitter is grounded.

The first signal for the first function of the key K1 is directly derived from the second terminal of K1, i.e. OUTPUT1. And the second signal for the second function is output through a terminal retrieved from the collector of T3, i.e. OUTPUT2. If the key K1 is pressed for less than a predefined time period, it will just send out the first signal via OUTPUT1. And if K1 is pressed for a period no less than the predefined time period, the circuit will also output the second signal via OUTPUT2. In the present embodiment, outputs are considered active when at a low voltage level, i.e. substantially connected to ground 'G'.

Now the working processes of the two-function circuit will be described below. Initially the capacitor C1 is fully charged by the source voltage Vcc through the resistors R2 and R3. When K1 is pressed, C1 will discharge through R1 and K1 to ground. The predetermined time threshold to discharge C1 and subsequently to trigger the second function is basically decided by the value of R1 and C1. So the discharging circuit can be seen as a timing circuit too. The predefined time can be calculated based on the values of R1, C1 and R4 together with the characteristics of T2.

If the predefined time is long, a resistor can be added between the emitter of T2 and Vcc. When calculating the predefined time, the added resistor should be considered too, which a skilled in the art can understand through the teaching in the description. The resistor can decrease the voltage of T2's emitter and thus the voltage of C1 will discharge more to turn on T2, which can delay the predefined time threshold. And R3 is used to control the current of recharging C1 for safety reason. But if the forward current is in the range of T1 requirement, R3 can be omitted.

When the key K1 is pressed for a period less than the predefined time threshold, the detecting circuit can not output a low level signal at the OUTPUT2, and thus the second function will not be triggered. Because in this condition the voltage of the originally charged C1 is not low enough to turn on the PNP transistor T2, while when T2 is in 'off' status, the potential at the base of T3 will be 'low', and T3 will not be turned on, and thus the voltage at the collector of T3 will not be low enough to trigger the second function signal. So it seems that just the normal key's status is monitored from the OUTPUT1 by the controller, and only the first function is enabled. The controller indicated here can be a CPU, microprocessor, or other processors to process signals in all kinds of circumstances.

When K1 is pressed for a period no less than the predefined time threshold, C1 will discharge and its voltage will be low enough to make the transistor T2 turned on. Afterwards, current goes through the resistor R5 and the voltage level of R5 will rise up, which makes the potential on the base of T3 be 'high', and transistor T3 is turned on. When T3 is turned on, the second signal for second function, such as a low-level reset signal, will be generated at the OUTPUT2.

From above description it can be concluded that the second signal for the second function doesn't rely on software and is generated based on hardware. The advantage is if the software has something wrong and causes the controller to be blocked, the second function can still be performed. For example, in a PC computer, even when the program breaks down, it still can be manually and externally reset the whole system by the hardware reset button.

And then when K1 is released, the base of T1 will be at high level and T1 will be turned on. The current goes through the resistor R3 and the transistor T1 to recharge the capacitor C1. In a detailed embodiment, the resistance of R3 is much lower than that of R1, so the recharging time is much shorter than the discharging time. In this way, the circuit ensures a fast recharge operation and ensures that the next press operation on K1 can work properly.

After the voltage of C1 increases to a certain amount through the recharging circuit, the voltage level at the base terminal is high enough to turn off transistor T2. When T2 is turned off, T3 is turned off too. The second signal retrieved from the OUTPUT2 will be on a high level and the second reset function is inactive.

When K1 is not pressed, all transistors in the circuit will be turned off. Therefore, the whole reset circuit consumes substantially no power. In the circuit, the resistors R2-R6 are bias resistors. They are used to control the current and make the transistors work properly.

In a variant of the first embodiment, if there is only the second output of the K1, i.e. there is no OUTPUT1 and only OUTPUT2 exists, the circuit can still fulfill the second function, when K1 is pressed no less than the predefined time period.

Figure 3:
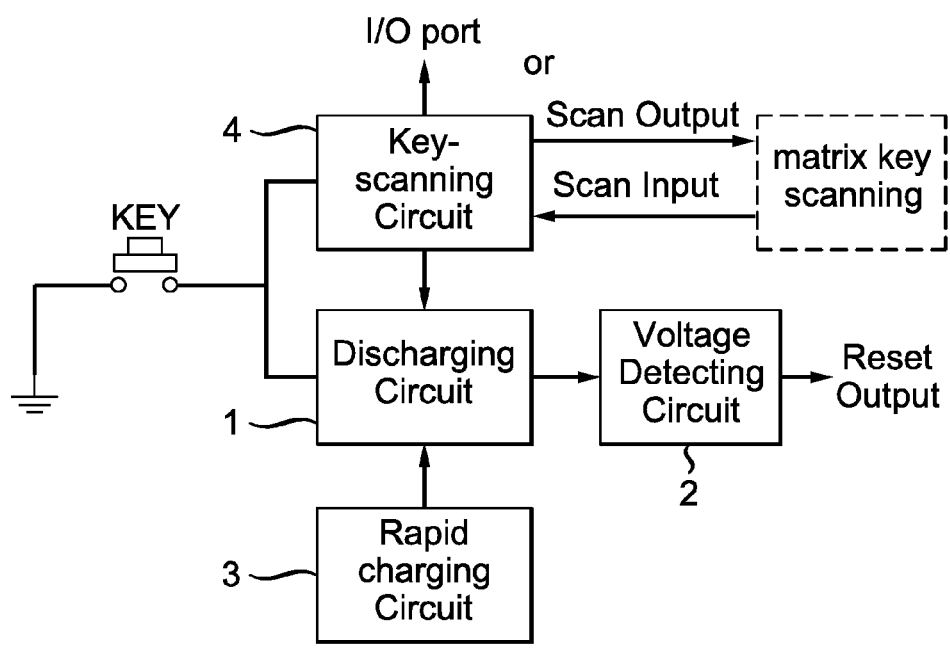
FIG. 3 show a block diagram of principle of a key circuit which can perform two functions and can work with a matrix key scanning circuit or a I/O port.

FIG. 3 shows a block diagram of principle of a key circuit which can perform two functions and can work with a matrix scanning circuit or I/O port. The key circuit mainly includes a key, a discharging circuit 1, a voltage detecting circuit 2, a rapid charging circuit 3, and a key scanning circuit 4. The first function is a normal key function which can be detected by a I/O port or the matrix key scanning circuit by Scan Output, and the second function is for example a reset function.

Figure 4:
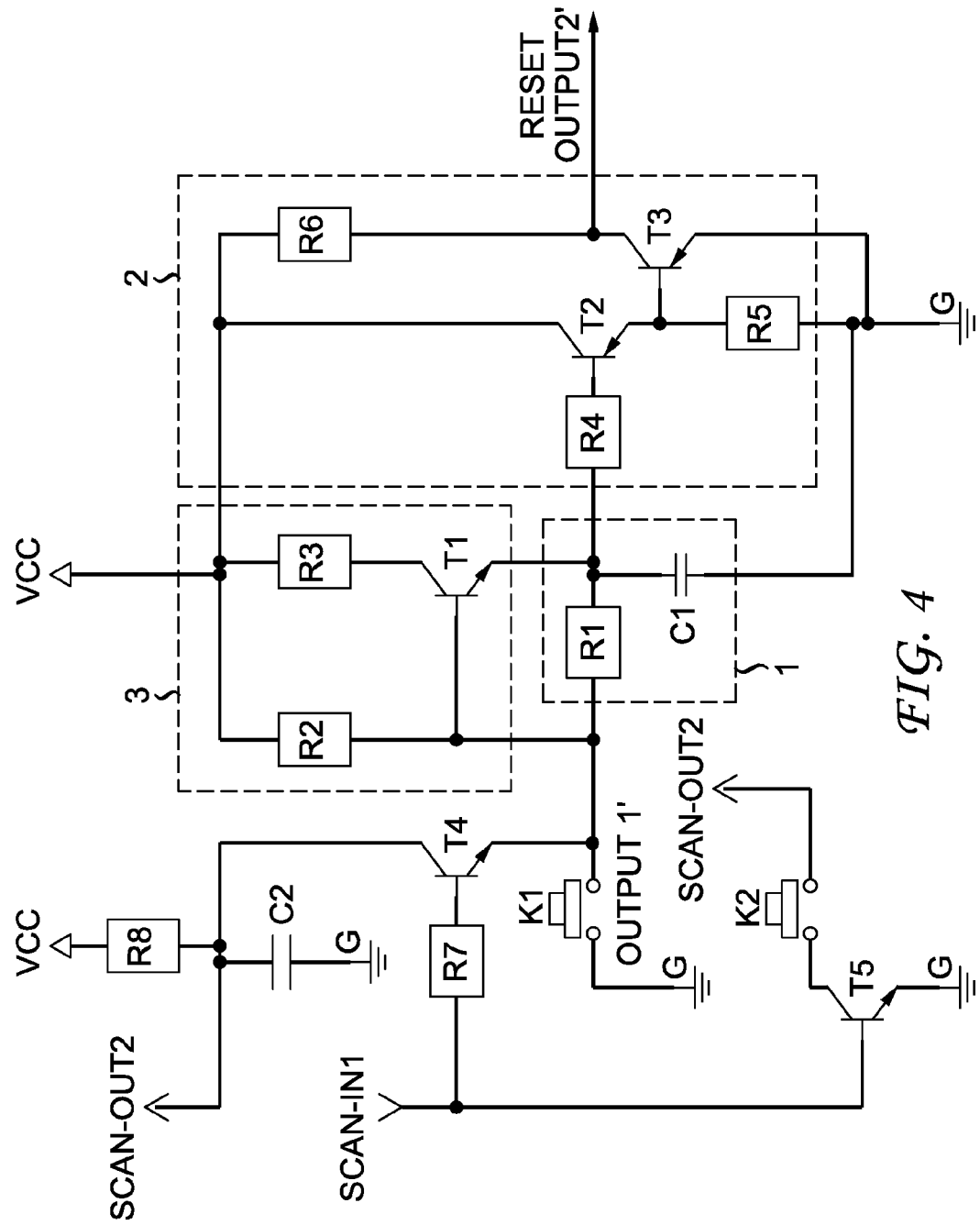
FIG. 4 shows a circuit diagram in which a two-function key is working with a matrix scanning circuit according to a second embodiment.

In another embodiment, as shown in FIG. 4, it illustrates a detailed implementation of the principle in FIG. 3. As shown in FIG. 4, the two-function key is in a key matrix and is working with a matrix key scanning circuit. In the key matrix, K1 and K2 are two keys to illustrate the present principle, wherein K1 is the present two-function key and K2 is a traditional single functional key. K2 used here is to demonstrate that K1 can perform well the two functions without affecting other keys' performance. Here we suppose K1 and K2 belong to a same row but in different columns of the key scanning circuit. The key scanning matrix circuit can detect the first signal for the first function of K1 from OUTPUT1'.

When there are multiple keys in a key matrix, a key-scanning circuit can be used. There are two types of key driver circuits: matrix key scanning and I/O port input directly.

Matrix key scanning is a method according to which sharing of the input/output port of the controller by the key matrix outputs is performed, thereby saving port resources. The controller here can be a CPU, a microcomputer, or other processing means that can detect/process the status of keys and process them. The matrix key scanning controller will scan all rows, activating each one by one at scan input pins in order to input signal to the present circuit. When a row is activated, the controller detects from each scan output pin which columns are 'activated'. The designation of Rows and columns can be swapped.

The I/O port method is an easy and direct way to monitor the status of keys. It consists in using an I/O port for each key and detecting the input from each port to acquire the status of each key.

The discharging circuit 1, the voltage detecting circuit 2, and the recharging circuit 3 in FIG. 4 are the same with those in FIG. 2, so the elements in these parts are indicated by using the same signs as in FIG. 2 and will not be elaborated for clarity. In addition, to carry out the matrix key scanning function, a fourth transistor T4, two resistors R7 and R8, a capacitor C2 is used for K1, and a transistor T5 is used for K2. As can be seen from FIG. 4, the emitter of T4 is connected to the second terminal of K1, i.e. OUTPUT1', the base of T4 is coupled to SCAN-IN1 through R7, and the collector of T4 is coupled to the SCAN-OUT1 with the voltage to be detected being smoothed by C2, wherein the collector of T4 is connected to the source voltage Vcc through R8 and grounded to G through C2.

In FIG. 4, SCAN-IN1 is a row scanning input port to input signal from the controller to the present circuit, while SCAN-OUT1 and SCAN-OUT2 are column scanning output ports to output a key pressing signal from the present circuit to the controller. The controller activates the row scanning input port SCAN-IN1 and inputs high level voltage. Thus transistor T4 and T5 are turned on. Then the controller checks its column input ports from SCAN-OUT1 and SCAN-OUT2. When neither K1 nor K2 is pressed, neither row SCAN-OUT1 nor SCAN-OUT2 is activated and is kept at high level. When K1 is pressed, SCAN-OUT1 is pulled down to a low level and SCAN-OUT2 stays at a high level. In this way, the controller can detect which key is pressed. The purpose of T4 and T5 is to improve the load capacity of output ports in the matrix, which means T4 and T5 are used as amplifiers so that the controller can drive more key circuits at the same time. If the CPU's I/O ports' load capacity is enough, these transistors can be omitted.

When K1 is pressed, C1 will discharge through R1 and K1 to the ground. The value of R1 and C1 decides the discharging time. When K1 is pressed for a period not shorter than the predefined time threshold, the voltage of C1 is low enough and T2 is turned on. Thus current goes through R5 and the voltage of R5 rises, which makes T3 turn on. At last, a low-level reset signal is triggered at the collector of T3, i.e. OUTPUT2'.

Once the key K1 is released, the base of T1 goes back to high level again. So T1 is turned on and current goes through R3 and T1 to charge C1. R3 being chosen so as to be of much smaller resistance than R1, the charging time is much shorter than the discharging time. In this way it will ensure the same discharging time if K1 is pressed again within a short time period. After the voltage of C1 increases to a certain amount, T2 and T3 are turned off. The collector of T3 from which the reset signal is triggered becomes high-level and the reset signal is inactive. Before K1 is pressed again, all transistors remain turned off. Therefore, the whole reset circuit consumes no power. Resistors R2 to R8 are the bias resistors for transistors. They are used to control the current and make the transistors work properly. Capacitor C2 is used to filtering the voltage and can restrain the voltage to avoid overshoot or flicker occurring.

Figure 5:
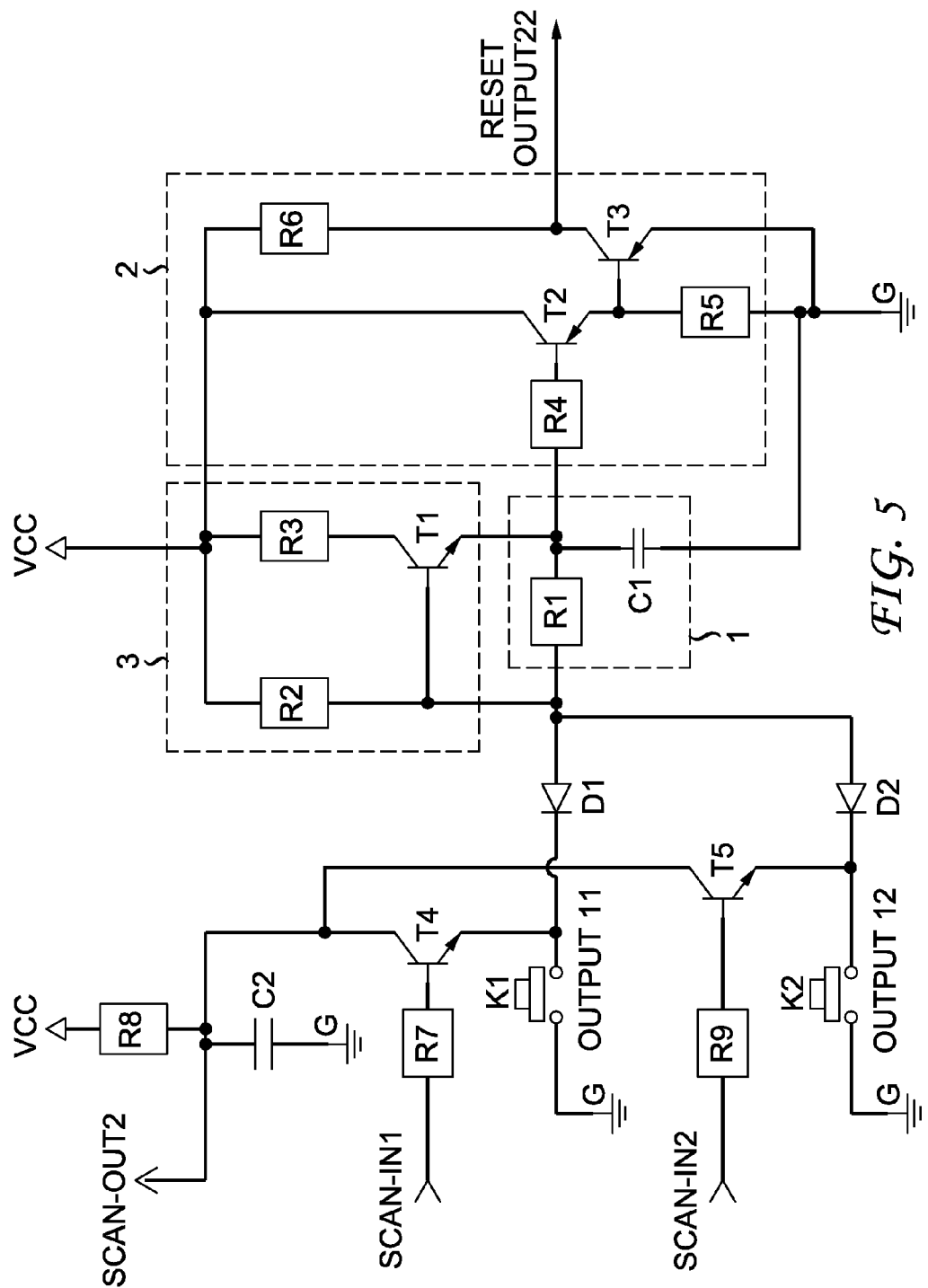
FIG. 5 shows a circuit diagram in which two function keys are working with a matrix scanning circuit according to a third embodiment.

FIG. 5 gives a third embodiment, in which K1 and K2 both are keys with a second function, e.g. reset function and in a key matrix and work with a matrix scanning circuit. FIG. 5 uses same signs for same elements as in FIG. 2 and FIG. 4. In FIG. 5, K1 and K2 share the discharging circuit 1, the voltage detecting circuit 2, and the recharging circuit 3, and share the SCAN-OUT1 to send signal to the controller. K1 and K2 independently receive signal from the matrix scanning circuit from SCAN-IN1 and SCAN-IN2 respectively.

To ensure the proper performance of K1 and K2, between OUTPUT 11, which is at the second terminal of T1, and R1, a diode D1 is connected and it conducts in the direction from R1 to K1. Similarly, a second diode D2 is connected between OUTPUT12, which is at the second terminal of T1, and R1, and it conducts in the direction from R1 to K2. Differently from FIG. 4, in FIG. 5, the collector of T5 is connected to the collector of T4 to share the SCAN-OUT1. Similarly with K1, for K2, a resistor R9 is connected between the base of T5 and the SCAN-IN2.

In FIG. 5, K1 and K2 are supposed to be in the same column but in different rows. SCAN-IN1 and SCAN-IN2 signals will alternately go active. When SCAN-IN1 inputs a high-level scanning signal, transistor T4 is turned on and T5 keeps off because SCAN-IN2 is at low-level. SCAN-OUT1 will show a high-level if K1 is not pressed, even if K2 is pressed at this point. When K1 is pressed down, the low-level active signal is monitored at SCAN-OUT1. The same principle will be used for K2. K1 and K2 have no interaction. T4 and T5 are used to improve the load capacity if the processor's I/O port cannot support enough current.

When key K1 is pressed, C1 is discharged and starts the timing for the second function of key K1. Though the voltage over C1 is decreasing, it does not influence the monitoring of K2's status due to the insulation provided by diode D2. For example, if K1 is pressed and K2 is not, the cathode of diode D1 follows the anode of D1 and goes to low-level. But the cathode of D2 still is high-level because of the one-way conduction of the diode. Thus the controller can detect that K2 is not pressed due to the high-level signal output. If K2 is pressed too, it will output an active low-level signal to the controller. So K1 and K2 have no interaction. All keys can share the timing circuit. Several keys can be pressed simultaneously without significantly affecting the time required to trigger the second function because the keys can be deemed as grounded once they are pressed and the diodes won't affect the C1's discharging much. Also, the timing function doesn't impact the key-scanning function.

In above mentioned embodiments, the second function is activated when the circuit outputs a low level at OUTPUT2 (see FIG. 2) or OUTPUT2' (see FIG. 4) or OUTPUT22 (see FIG. 5) and inactivated when the circuit outputs a high level at OUTPUT2 or OUTPUT2' or OUTPUT22. However, those skilled in the art can understand the second function can be activated and inactivated under reverse conditions.

In above mentioned embodiments, the connection between T3 and T4 can be reverted too. That is, firstly the NPN transistor T4 is turned on, and secondly the PNP transistor T3 is turned on. In this condition, the other related circuits should be changed accordingly.

In all mentioned embodiments, PNP and NPN transistors in these embodiments can be replaced by PMOS and NMOS too. Further, though in above embodiments, T3 is a NPN transistor, it can also be a PNP transistor. If so, the base of T3 should be connected to the emitter of T2 and the second signal is derived from the emitter of T3.

Advantageously, since the transistors are turned off when the keys are open, there is almost no power consumption.

Besides of the reset function, the multiple keys circuit with key-scan and timing function can be used in all the cases that demand triggering a signal after pressing any one of the keys a certain time. For example, this can be applied to an alarm light to be turned on when any one of the keys is pushed too long.

The invention claimed is:

1. A key press detecting circuit for detecting the status of a key (K1), characterized in that it comprising:
    a discharging circuit (1) consisting of a Resistor-Capacitor (R1, C1) circuit, which is connected to the key (K1) and discharges when the key (K1) is pressed, and
    a voltage detecting circuit (2), which is connected to the discharging circuit (1) and comprises a combination of a first transistor (T2) and a second transistor (T3), wherein when the discharging circuit discharges for a predefined period, the first transistor (T2) will be turned on and outputs a voltage to turn on the second transistor (T3) so that the second transistor (T3) outputs a second signal for a second function, and
    wherein both the first transistor (T2) and the second transistor (T3) are PNP transistors and the base of the second transistor is connected to the emitter of the first transistor.

2. The key press detecting circuit according to claim 1, wherein the predefined period is at least determined by the resistor (R1) and the capacitor (C1).

3. The key press detecting circuit according to claim 1 or 2, wherein the first end of the key (K1) is grounded and the second end of the key (K1) is connected with the Resistor-Capacitor (R1, C1) circuit.

4. The key press detecting circuit according to claim 3, wherein it further includes a charging circuit (3) to charge the capacitor (C1) of the discharging circuit (1) when the key (K1) is released.

5. The key press detecting circuit according to claim 4, wherein the charging circuit includes a transistor (T1) which is turned on to charge the capacitor (C1) when the key (K1) is released.

6. The key press detecting circuit according to claim 5, wherein the first transistor (T2) and the second transistor (T3) are turned off when the voltage of capacitor (C1) is charged to a level not low than the threshold of the first transistor (T2).

7. The key press detecting circuit according to claim 1, wherein the second signal is generated from the emitter of the second transistor.

8. The key press detecting circuit according to claim 3, wherein if the key is pressed for a period less than the predefined period, a first signal will be sent out from the second terminal of the key (K1).

9. The key press detecting circuit according to claim 8, wherein the first signal is output to a key matrix scanning circuit as its input.

10. The key press detecting circuit according to claim 9, wherein there is an additional key (K2) connected with the key (K1) in parallel to share the discharging circuit, the voltage detecting circuit and a charging circuit.

11. The key press detecting circuit according to claim 10, wherein said additional key (K2) is a single function key.

12. The key press detecting circuit according to claim 10, wherein said additional key (K2) is a double function key.

* * * * *